United States Patent [19]
Selcuk

[11] Patent Number: 5,825,175
[45] Date of Patent: Oct. 20, 1998

[54] MAGNETIC SENSORS

[75] Inventor: Ahmet Selcuk, Worsley, United Kingdom

[73] Assignee: Lem Heme Limited, Lancs, England

[21] Appl. No.: 669,559

[22] PCT Filed: Jan. 17, 1995

[86] PCT No.: PCT/GB95/00081
§ 371 Date: Sep. 17, 1996
§ 102(e) Date: Sep. 17, 1996

[87] PCT Pub. No.: WO95/20167
PCT Pub. Date: Jul. 27, 1995

[30] Foreign Application Priority Data

Jan. 19, 1994 [GB] United Kingdom .................. 9400960

[51] Int. Cl.⁶ .................................................. G01R 33/00
[52] U.S. Cl. ...................................... 324/117 H; 324/127
[58] Field of Search .................................. 324/127, 126, 324/117 H, 252, 129, 117 R

[56] References Cited

U.S. PATENT DOCUMENTS

| | | | |
|---|---|---|---|
| 3,219,930 | 11/1965 | Sipler | 324/117 |
| 4,059,798 | 11/1977 | Dierker et al. | 324/127 |
| 4,283,677 | 8/1981 | Niwa | 324/127 |
| 4,378,525 | 3/1983 | Burdick | 324/127 |
| 4,513,246 | 4/1985 | Blain | 324/127 |
| 5,349,289 | 9/1994 | Shirai | 324/127 |
| 5,473,244 | 12/1995 | Libove et al. | 324/126 |

FOREIGN PATENT DOCUMENTS

| | | | |
|---|---|---|---|
| A-0240959 | 10/1987 | European Pat. Off. | G01R 15/02 |
| A-0510376 | 10/1992 | European Pat. Off. | G01R 15/02 |
| A-3817299 | 11/1989 | Germany | G01R 15/00 |
| WO 92/12432 | 7/1992 | WIPO . | |

*Primary Examiner*—Ernest F. Karlsen
*Assistant Examiner*—Anh Phung
*Attorney, Agent, or Firm*—Jenkins & Wilson, P.A.

[57] ABSTRACT

The invention concerns magnetic sensors and, particularly, a magnetic sensor arrangement for use in an electrical measuring device. In the device, magnetic sensors are provided within recesses formed in the arms of the device. The recesses are typically formed within laminations and act so as to shield the magnetic sensors from interference, whilst enabling them to detect a magnetic field of an electrical conductor placed between the two arms.

14 Claims, 4 Drawing Sheets

MAGNETIC SENSORS

The invention relates to magnetic sensors.

Magnetic sensors find application in fields in which remote sensing of magnetic fields or electrical current is required.

In a typical application, magnetic sensors, such as Hall effect sensors, are used in hand-held measuring devices. Such a hand-held measuring device might typically include a pair of jaws which can be opened and closed so as to admit the passage of an electrical conductor therebetween. With the electrical conductor in place, the jaws are closed and one or more magnetic sensors situated within the jaws are arranged to generate an electrical output which is dependent upon a current flowing through the conductor.

In devices of the type described above, the sensors are generally positioned adjacent to at least one end face of the jaws. By necessity, the sensor must not be shielded magnetically from the electrical conductor held in the space defined by the closed jaws. In this respect, it is usual for end faces of the jaws, where the sensors, which may be in the form of integrated circuits or chips, are located, to be simply covered by a plastic cap. Unfortunately however, having the sensor covered in such a manner means that not only is it influenced by magnetic fields generated by the conductor, but it can also be influenced by stray fields from outside of the region defined by the closed jaws and so give false or inaccurate readings.

German patent application DE-4-3,817,299 discloses a magnetic sensor arrangement forming part of an electrical measuring device having means for being fitted around an electrical conductor for the measurement of a property associated with the conductor, wherein the sensor arrangement is at least partially shielded from one or more sources of interference. This is achieved by locating a current sensor element within a recess of a core material and covering the current sensor with an earthing element and a cover plate.

According to a first aspect of the invention, a magnetic sensor arrangement forming part of an electrical measuring device, the device having means for being fitted around an electrical conductor for the measurement of a property associated with the conductor and, wherein the sensor arrangement comprises at least one sensor mounted in a recess formed in an end face of one of a pair of arms of a given material the arms being mounted for movement towards and away from one another, said arms forming said means for being fitted around an electrical conductor and being characterised in that said end faces are exposed such that with the arms in a closed position a continuous loop of the material is formed to thereby shield the, or each, sensor from one or more sources of interference.

The interference may be magnetic interference.

A pair of sensors may be provided.

Preferably, the, or each, sensor is mounted on or within the means for being fitted around an electrical conductor.

The arms are preferably mounted on a body member for movement with respect to the body member.

The arms, or the loop, preferably comprise magnetically permeable material.

The material may be formed from a number of laminations.

Alternatively, the material may comprise a strip wound core.

If the material is a strip wound core, then the recesses may be formed by milling. If the material comprises a number of laminations, then the form of the laminations may be arranged so as to provide the recess, or recesses.

The recesses are preferably formed such that the, or each, sensor is exposed to a magnetic field generated by the electrical conductor, but is shielded from stray fields.

Preferably, electrical windings are provided around the arms and the, or each, sensor forms part of a control circuit, whereby a primary current flowing in the electrical conductor, induces a first magnetic flux within the material of the arms, and an output from the, or each, sensor, is used to control a secondary current flowing in the windings. Preferably, the secondary current is arranged to induce a secondary flux in the material, which is opposed to the primary flux generated by the conductor, and the, or each, sensor is arranged to control the amount of said secondary current so that a point is reached when the secondary flux exactly balances out the primary flux and, at that point, the output from the, or each, sensor is zero.

The above technique is known as flux-nulling and, with this technique, the value of the primary current can be very accurately determined.

Preferably, the magnetic sensor comprises a Hall effect sensor.

According to a second aspect the invention extends to an electrical measuring device incorporating the magnetic sensor arrangement of the first aspect. Any features or combination of features according to the first aspect of the invention may be combined with the device of the second aspect.

By way of example, a specific embodiment of the present invention will now be described, with reference to the accompanying diagrammatic drawings, in which.

Figure 1:
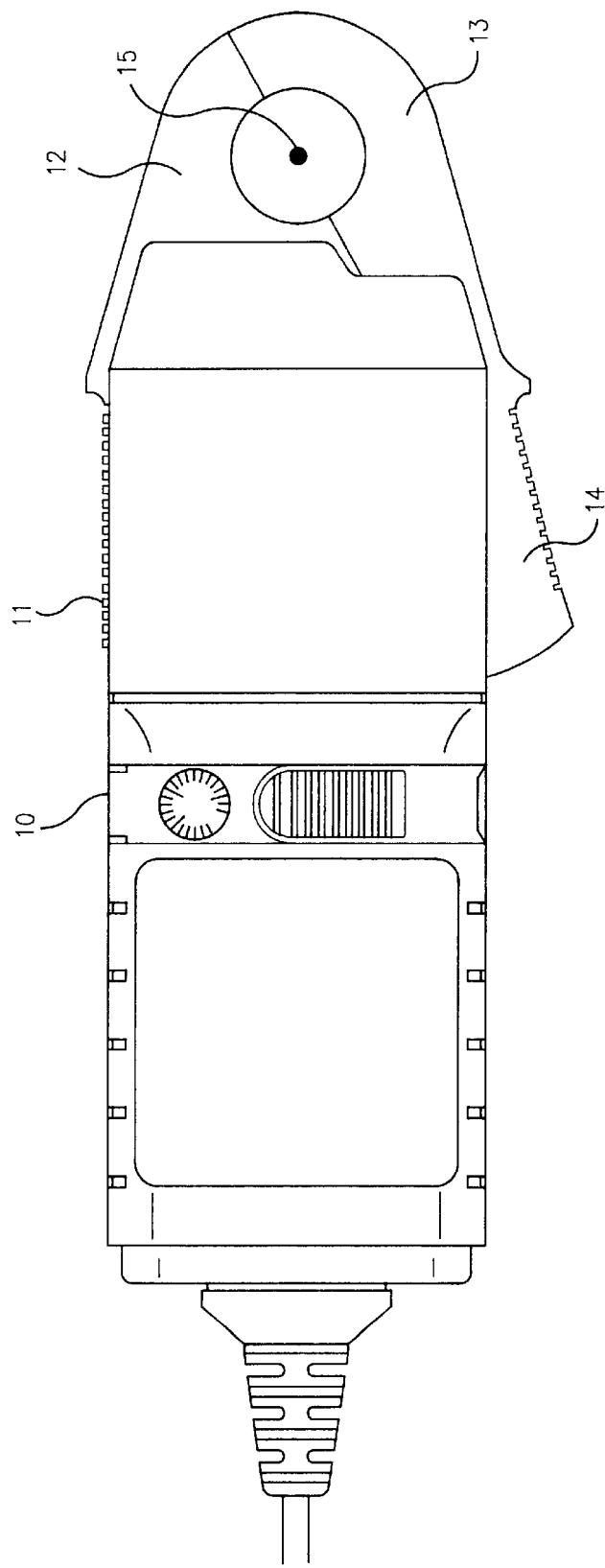
FIG. 1 shows a hand-held measuring device, employing a pair of magnetic sensors.

In the device shown in FIG. 1, a housing 10 is provided having a generally rectangular portion 11 for holding in the hand. Projecting from the portion 11 are a pair of jaws 12, 13 which can be opened by operation of a trigger 14 to clip the device around an electrical conductor. In use, the conductor will extend along the axis 15 shown in FIG. 1, inside closed jaws 12, 13, which contain a pair of arms of ferromagnetic material in which currents are induced by the electromagnetic field generated by the conductor. The jaws 12, 13 also contain a pair of magnetic sensors which, in the embodiment described, are Hall effect sensors which generate an output which is dependent upon the current flowing in the conductor.

Figure 2:
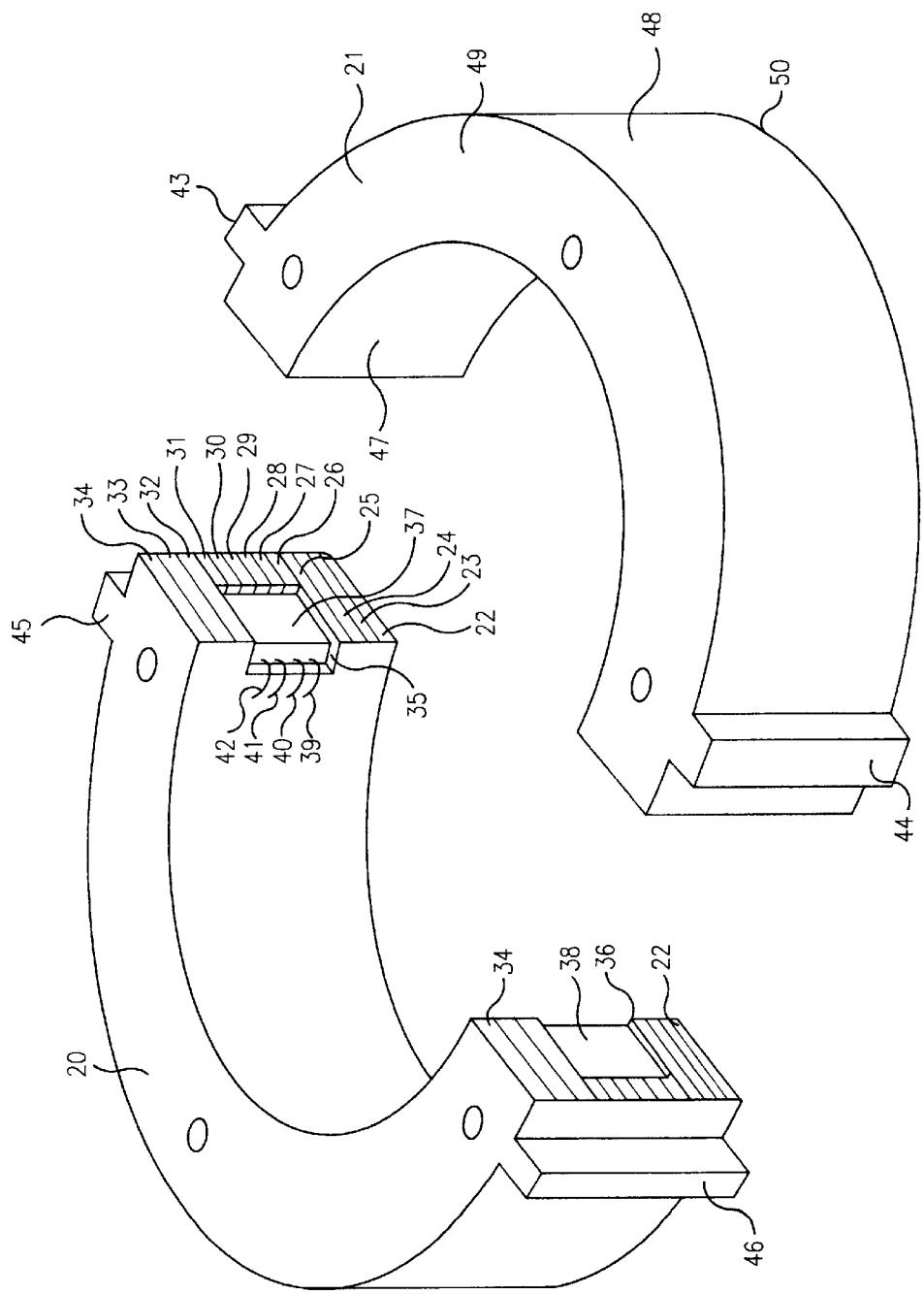
FIG. 2 shows a pair of arms incorporating magnetic sensors.

Referring to FIG. 2, a pair of arms 20, 21 are shown. The arms 20, 21 are shown as being generally semi-circular in formation, but they may in fact have any suitable formation.

Figure 3:
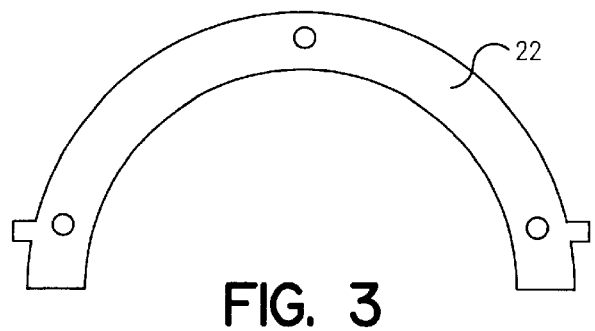
FIG. 3, 4 and 5 show different types of laminations which may be utilised for the formation of the arms of FIG. 2.
Figure 4:
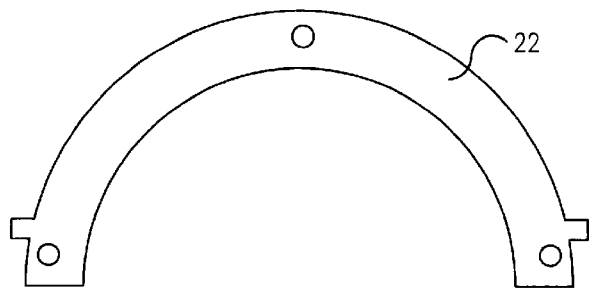
Figure 5:
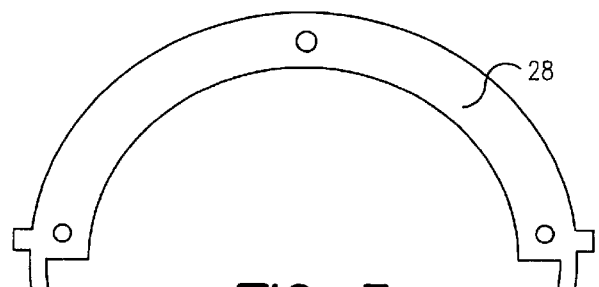

The arms 20, 21 are made up of successive laminations 22–34 stacked one above another. The laminations are of an electrically conducting material. Laminations 22 to 25 and 32 to 34 have a first configuration, such as that shown in FIG. 3 or FIG. 4 and laminations 26 to 31 have a second configuration, such as that shown in FIG. 5. These two configurations of laminations combine to form the recesses 35, 36 in end regions of the arm 20.

The two recesses 35, 36 each house a Hall effect sensor 37, 38.

The Hall effect sensors 37, 38 each have output connections 39 to 42. Although these connections are, in the diagram of FIG. 2, shown as being unconnected, they would, in use, be connected to wires which would lead into an electrical measuring device such as the device 10 of FIG. 1.

The arms 20, 21 have protrusions 43, 44, 45 and 46 which act as keying members for the reception of a plastic cover or similar (not shown), so as to provide electrical insulation on inner, outer, upper and lower faces 47, 48, 49, 50 of the jaws. The plastic cover does not extend over the end faces of the arms 20, 21.

The plastic covering which is not shown in FIG. 2, but which is shown in FIG. 1, provides protection for the user of a device such as the device 10.

In use, the arms 20, 21 contained within the jaws 12, 13 as part of the device 10 are opened so as to allow an electrical conductor to be positioned between them. Once the electrical conductor is in place, the jaws are closed.

The electrical device 10 may then be used to measure any one of a number of parameters relating to the current flowing through the conductor.

The device works as follows: a primary current flowing in a conductor placed between the jaws 12, 13 creates a magnetic field around the conductor. The magnetic field causes a first magnetic flux to be induced in the magnetically permeable material of the jaws. Electrical windings are provided around the jaws, within the plastic covering and these windings are used to generate a second magnetic flux within the jaws, opposing the first flux.

The total magnetic flux is detected by the Hall effect sensors 37, 38, the outputs of which are used within a feed back system to control the level of secondary current, and therefore secondary flux.

When a situation is reached in which the output of the Hall effect sensors is substantially zero, a state will have been reached in which the secondary current, generated within the device 10 exactly cancels out the magnetic field induced in the jaws by the primary current. In this manner, the primary current can be easily and accurately determined.

The above measurement technique is known as flux-nulling.

Because the Hall effect sensors 37, 38 are actually positioned within recesses formed in the arms 20, 21 the transducers 37, 38 are shielded from any stray external fields which do not emanate from within the closed jaws.

Due to the fact that the end faces of the arms are exposed, the pair of arms 20, 21 when joined together form a single magnetic circuit loop. This loop acts as an efficient magnetic conductor and gives the device 10 very good high frequency characteristics.

Because of the shielding effect brought about by housing the Hall effect sensors 37, 38 within recesses 35, 36, the device typically rejects stray field effects by an order of up to 10 times that of devices incorporating unshielded magnetic sensors.

As an alternative to the arms 20, 21 being made up of laminations, the arms may be formed from a strip wound core having recesses milled into or otherwise formed in the end faces for acceptance of the Hall sensors 37, 38.

Figure 6:
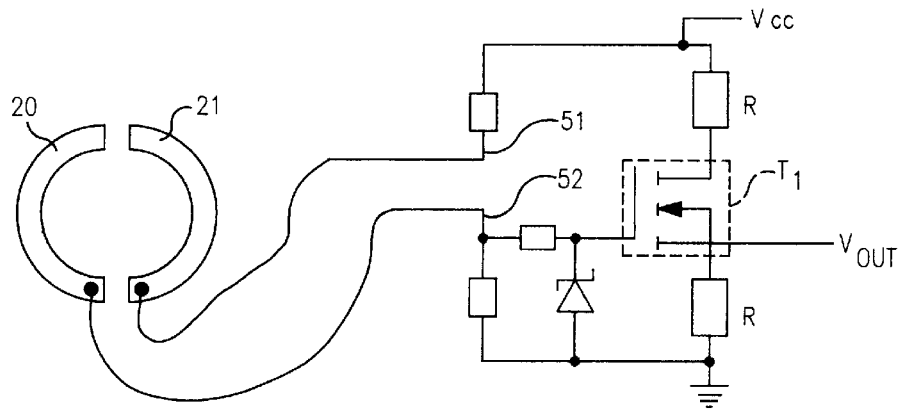
FIG. 6 shows an arrangement whereby the arms of the device may be used as a switch for controlling operation of the device.
Figure 7:
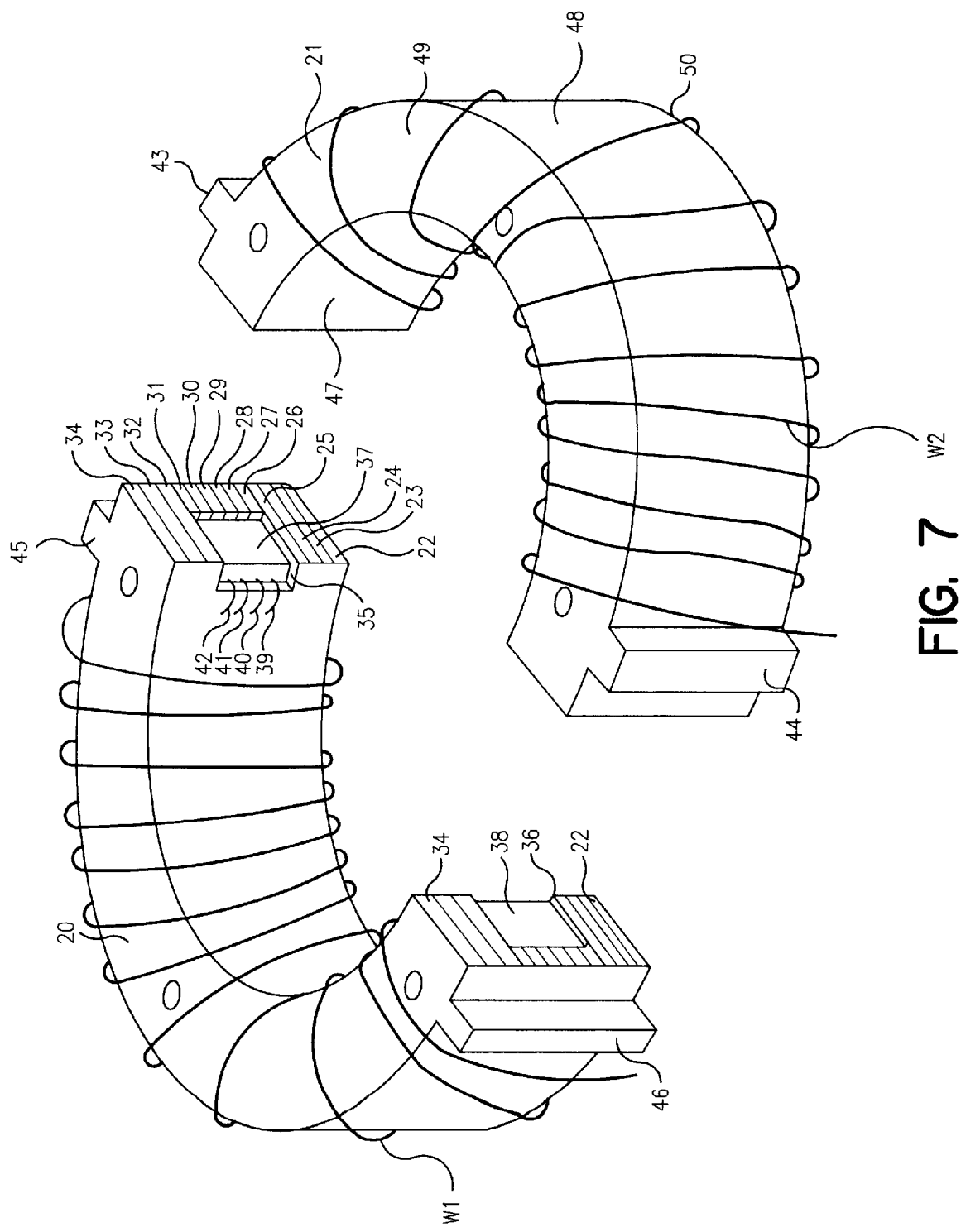
FIG. 7 shows electrical windings (W1, W2) respectively around each arm (20, 21).

As mentioned previously, once the jaws 12, 13 are closed and the end faces of the arms 20, 21 are in contact with one another, the electrical device 10 may be brought into operation to measure relevant parameters. FIG. 6 shows an exemplary circuit for indicating when the jaws are closed.

As can be seen from FIG. 6, the arms 20, 21 are arranged to have electrical connections placed thereon so that when the jaws 12, 13 close a short circuit is formed between nodes 51, 52. Effectively, bringing nodes 51 and 52 together enables the transistor $T_1$ to turn on and enable an output voltage $V_{out}$ to be generated to the device 10. In the case illustrated, since the two resistors R have an identical value, $V_{out}$ will be 0.5 $V_{CC}$. With the jaws open and the arms 20, 21 separated from one another nodes 51 and 52 are disconnected and transistor $T_1$ is unable to turn on. In those circumstances, $V_{out}$ will be at ground voltage. From this discussion, it can therefore be seen that a very simple means of indicating when the jaws are closed is provided by using the jaws 12, 13 of the device 10 as a switch.

Various different configurations of arms or jaws may be adopted without departing from the scope of the present invention. For instance, one jaw may be fixed in position and the other may be moveable. Alternatively, some embodiments may not have jaws at all but may instead have a continuous or non-continuous loop.

I claim:

1. A magnetic sensor arrangement forming part of an electrical measuring device (10), the device (10) having means for being fitted around an electrical conductor for the measurement of a property associated with the conductor, and wherein the sensor arrangement comprises at least one sensor (37, 38) mounted in a recess (35, 36) formed in one of a pair of arms (20, 21) of a given material, characterized in that each of the arms (20, 21) is separately mounted on a body member for movement towards and away from one another and for movement by at least one of the arms (20, 21) with respect to the body member, said arms (20, 21) forming said means for being fitted around an electrical conductor and each of the arms (20, 21) having an end face that is exposed such that with the arms (20, 21) in a closed position a continuous loop of the material is formed thereby to shield said at least one sensor from one or more sources of interference, and the arrangement further including electrical windings provided completely around each of the arms (20, 21), and wherein said at least one sensor (37, 38) forms part of a control circuit whereby a primary current flowing in the electrical conductor induces a first magnetic flux within the material of the arms (20, 21), and an output from said at least one sensor (37, 38) is used to control a secondary current flowing in the windings.

2. An arrangement according to claim 1, wherein the interference is magnetic interference.

3. An arrangement according to claim 1, wherein a pair of sensors (37, 38) are provided.

4. An arrangement according to claim 1, wherein the, or each, sensor (37, 38) is mounted on or within the means for being fitted around an electrical conductor.

5. An arrangement according to claim 1 wherein the arms (20, 21) comprise magnetically permeable material.

6. An arrangement according to claim 5, wherein the material is formed from a number of laminations (22–31).

7. An arrangement according to claim 5, wherein the material comprises a strip wound core.

8. An arrangement according to claim 1, wherein the recess or recesses (35, 36) are formed by milling.

9. An arrangement according to claim 6, wherein the laminations (22–31) are formed so as to provide the recess or recesses (35, 36).

10. An arrangement according to claim 1, wherein the recess or recesses (35, 36) are formed such that the, or each, sensor (37, 38) is exposed to a magnetic field generated by the electrical conductor, but is shielded from stray fields.

11. An arrangement according to claim 1 wherein the secondary current is arranged to induce a secondary flux in the material, which is opposed to the primary flux generated by the conductor and the, or each, sensor (37, 38) is arranged to control the amount of said secondary current so that a point is reached when the secondary flux exactly balances out the primary flux and, at that point, the output from the, or each, sensor (37, 38) is zero.

12. An arrangement according to claim 1, wherein the sensor or sensors (37, 38) comprise a hall effect sensor or sensors.

13. An electrical measuring device (10) operatively incorporating the magnetic sensor arrangement of claim 1.

14. The arrangement according to claim 1 wherein the recess is formed in an end face of one of the pair of arms.

* * * * *